United States Patent
Chen et al.

(10) Patent No.: US 8,395,050 B2
(45) Date of Patent: Mar. 12, 2013

(54) FLEXIBLE PRINTED CIRCUIT AND DISPLAY MODULE COMPRISING THE SAME

(75) Inventors: Chien-Liang Chen, Hsinchu (TW); Chun-Yu Lee, Hsinchu (TW); Shih-Ping Chou, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 175 days.

(21) Appl. No.: 12/916,836

(22) Filed: Nov. 1, 2010

(65) Prior Publication Data

US 2011/0044014 A1    Feb. 24, 2011

Related U.S. Application Data

(62) Division of application No. 11/745,710, filed on May 8, 2007, now Pat. No. 7,847,196.

(30) Foreign Application Priority Data

Sep. 11, 2006    (TW) ................... 95133541 A

(51) Int. Cl.
*H05K 1/00*    (2006.01)
(52) U.S. Cl. ............................. 174/254; 174/268
(58) Field of Classification Search ............... 174/254, 174/268; 361/749–751
See application file for complete search history.

(56) References Cited

U.S. PATENT DOCUMENTS

| 4,385,213 | A |   | 5/1983 | Larson |         |
|-----------|---|---|--------|--------|---------|
| 5,404,239 | A |   | 4/1995 | Hirai  |         |
| 5,981,870 | A | * | 11/1999 | Barcley et al. | 174/254 |
| 6,372,992 | B1 |  | 4/2002 | Yang   |         |
| 2005/0139382 | A1 | * | 6/2005 | Chen | 174/255 |

FOREIGN PATENT DOCUMENTS

| JP | 4144188 | 5/1995 |
| TW | 516341  | 1/2003 |
| TW | I257566 | 7/2006 |

OTHER PUBLICATIONS

English translation of abstract of TW I257566, Jul. 1, 2006.

* cited by examiner

*Primary Examiner* — Jeremy Norris
(74) *Attorney, Agent, or Firm* — McClure, Qualey & Rodack, LLP

(57) ABSTRACT

A flexible printed circuit and a display module comprising the flexible printed circuit are disclosed. The display module comprises a display panel, a printed circuit board, and a flexible printed circuit. The flexible printed circuit electrically connects the display panel and the printed circuit board, and further comprises a flexible substrate and a cover lay. The flexible substrate has an upper surface and two opposite end portions. The cover lay is disposed on the upper surface of the flexible substrate and extends along a lengthwise direction of the flexible substrate. The cover lay further has two opposite sides each also extending along the lengthwise direction of the flexible substrate. Each of the sides has at least a partially continuous contour which is formed with a discontinuous status on at least one of the end portions.

8 Claims, 4 Drawing Sheets

FLEXIBLE PRINTED CIRCUIT AND DISPLAY MODULE COMPRISING THE SAME

CROSS-REFERENCES TO RELATED APPLICATIONS

This is a divisional application of patent application Ser. No. 11/745,710 filed on May 8, 2007, now allowed. The prior application Ser. No. 11/745,710 claims the benefit of Taiwan Patent Application No. 095133541 filed on Sep. 11, 2006, the disclosures of which are incorporated herein by reference in their entirety.

BACKGROUND OF THE INVENTION

1. Field of the Invention

The present invention relates to a flexible printed circuit and a display module comprising the flexible printed circuit; more specifically, relates to a flexible printed circuit for electrically connecting the display panel of a display module to a printed circuit board.

2. Descriptions of the Related Art

With the ever increasing use of consumer electronic products, high performance and light weight are required of modern electronic products. In corresponding to this trend, flexible printed circuit (FPC) boards with flexible characteristics have been widely used in various electronic equipments, such as various kinds of displays, laptops, mobile phones, digital cameras, personal digital assistants (PDA), printers and optical disc drives.

As shown in FIG. 1, a general flexible printed circuit structure comprises a flexible substrate 10 and a cover lay 11, wherein the flexible substrate 10 comprises an upper surface and the cover lay 11 is disposed on the upper surface of the flexible substrate 10. Two opposite sides 12, 13 of the cover lay 11 are continuous linear contours that extend along the lengthwise direction of the flexible substrate 10. While the flexible printed circuit is subjected to external forces (especially pulling, dragging, or twisting during assembling, transporting, and repairing) or is influenced by thermal expansion and compression that may generate unpredictable deformation, the produced stresses (tension or torsion stress) would be transferred to any frequently stressed surface of a printed circuit layout 14. Consequently, this may result in a development of a fracture or breakage condition in any region of the flexible printed circuit, further causing system malfunction. Because the breakdown region on the printed circuit is too small to be identified by eyes, it is difficult for maintenance workers or users to inspect such failures, hindering the overall repairing process.

As shown in FIG. 2, to solve the aforesaid problem concerning structural failure of the flexible printed circuit, existing techniques fabricate two sides 21, 22 of the cover lay 20 as a continuous extending wavy contour. Although the continuous extending wavy contour can buffer or scatter the concentrated stress of the printed circuit layout 24 to resist the fracture of leads, two end portions 25, 26 may still be susceptible to possible fractures due to an increased number of external dragging and pulling. The reason is that the problem of concentrated stress of the two end portions 25, 26 is not solved effectively. Because at least one of the two free end portions 25, 26 is usually the region of a lead for providing power to the whole system, a fracture in this area would cause the most serious damage.

Consequently, increasing the fracture resistance for the whole structure of the flexible printed circuit (especially for the two end portions of long printed circuits) without increasing fabricating difficulties is an objective for the corresponding industries.

SUMMARY OF THE INVENTION

One objective of this invention is to provide a flexible printed circuit comprising a flexible substrate and a cover lay. The flexible substrate has an upper surface and two opposite end portions. The cover lay is disposed on the upper surface of the flexible substrate and extends along a lengthwise direction of the flexible substrate. Additionally, the cover lay has two opposite sides extending along the lengthwise direction of the flexible substrate. Each of these sides has an at least partially continuous contour, which is formed with a discontinuous status on at least one of the end portions to enhance the fracture resistance for the whole structure, especially for leads located at two end portions.

Another objective of this invention is to provide a display module comprising a display panel, a printed circuit board, and a flexible printed circuit. The flexible printed circuit is capable of electronically connecting the display panel to the printed circuit board. The flexible printed circuit comprises the said structure to enhance the capability of resisting power failure for the whole display module.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
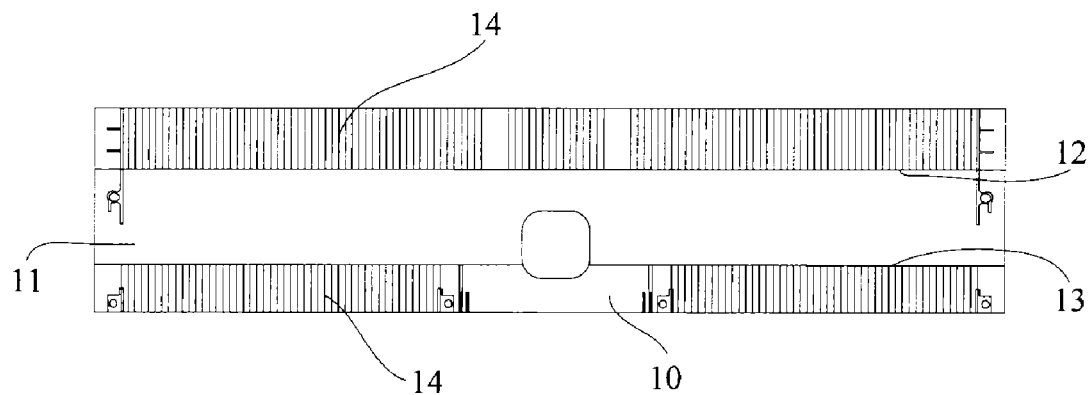
FIG. 1 is a schematic diagram illustrating a flexible printed circuit of the prior art.
Figure 2:
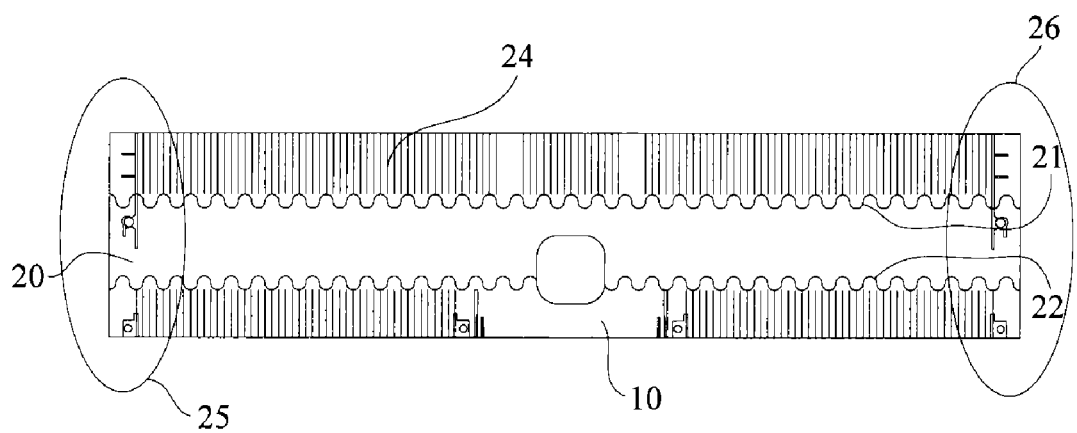
FIG. 2 is a schematic diagram illustrating another flexible printed circuit of the prior art.
Figure 3:
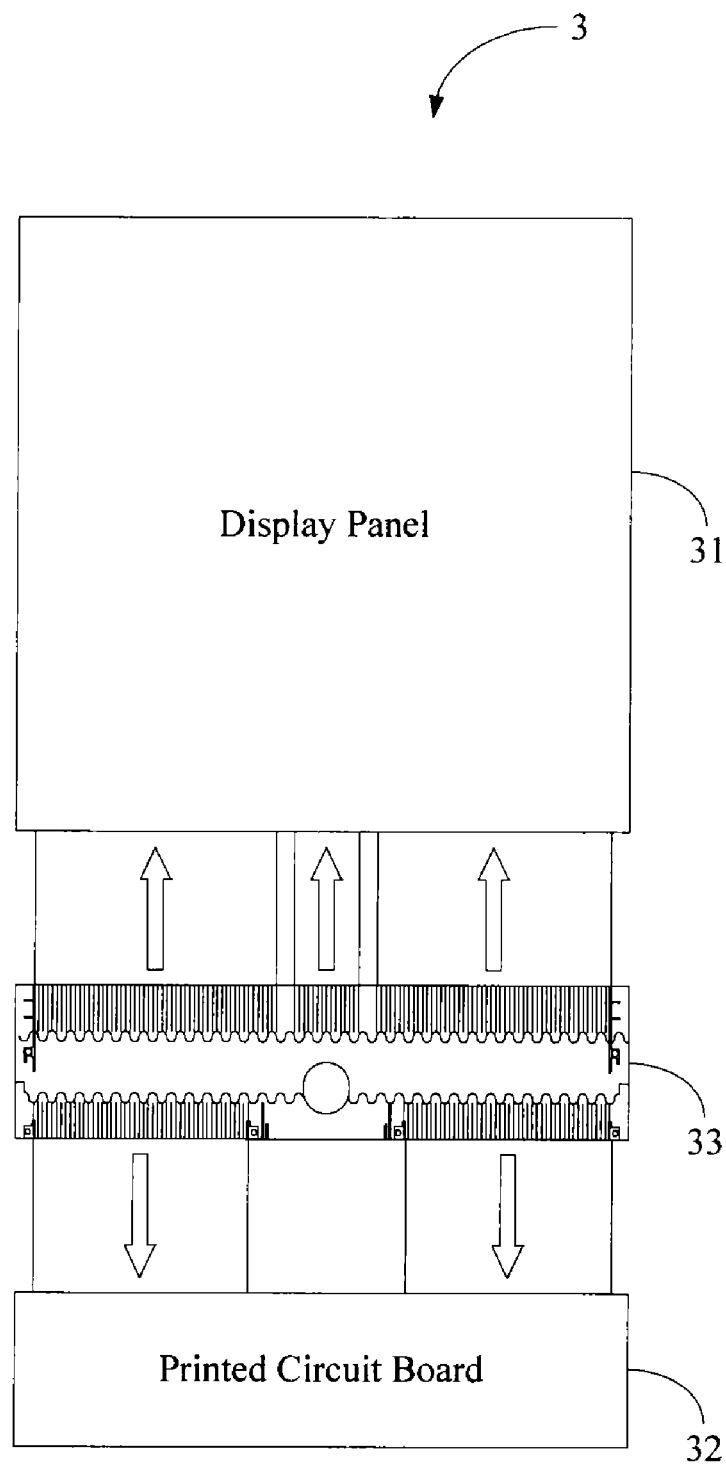
FIG. 3 is a schematic diagram illustrating the whole display module comprising a flexible printed circuit of this invention.

A display module 3 disclosed in this invention is shown in FIG. 3. The display module 3 comprises a display panel 31, a printed circuit board 32, and a flexible printed circuit (a flexible printed circuit board) 33. Please refer to FIG. 4 to FIG. 7. The flexible printed circuit 33 of the display module of this invention is capable of electronically connecting the display panel 31 to the printed circuit board 32, wherein the structure of the flexible printed circuit 33 comprises a flexible substrate 40, a cover lay 41, and at least a printed circuit layout 48 disposed on the flexible substrate 40.

The flexible substrate 40 comprises an upper surface, a lower surface and two opposite end portions. The cover lay 41 is disposed on the upper surface of the flexible substrate 40 and extends along a lengthwise direction of the flexible substrate 40. The cover lay 41 further comprises two opposite sides 43, 44 extending along the lengthwise direction of the flexible substrate 40. Each of these sides has an at least partially continuous contour, which is formed with a discontinuous status on at least one of the end portions. The printed circuit layout 48 is partially disposed between the cover lay 41 and the flexible substrate 40, wherein the printed circuit layout 48 has a leading wire connecting region 42 located on at least one of the two opposite end portions of the flexible substrate 40. Because the leading wire connecting region 42 comprises leads for providing system power, it is usually formed within the leading wire connecting region 42 for connecting a side of the printed circuit board. For the preferred embodiment, each of the sides of the cover lay 41 has a completely continuous wavy contour, which is formed with the discontinuous status on either one or both of the two opposite end portions of the flexible substrate 40.

For simplicity, the following embodiments only illustrate one of the two opposite end portions of the flexible substrate 40 for the discontinuous status of the cover lay 41.

Figure 4:
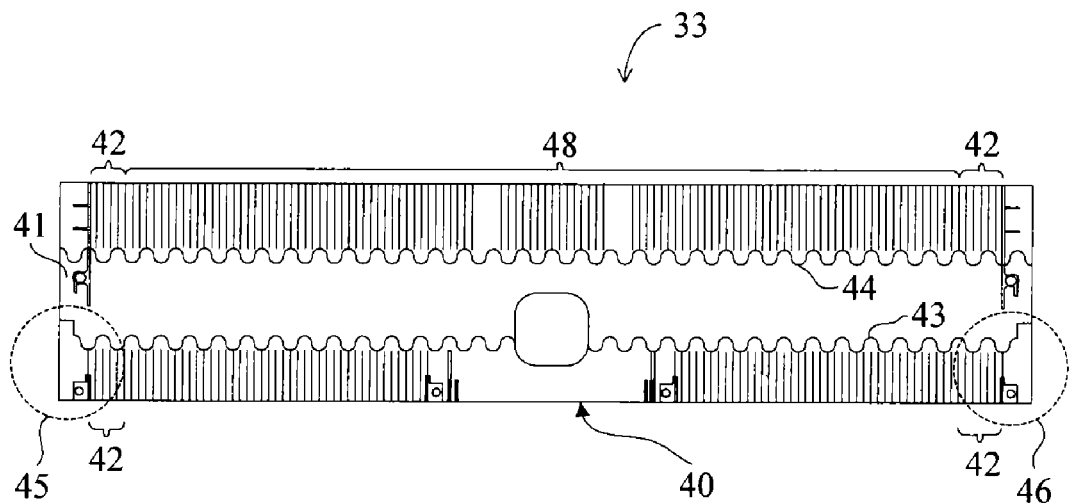
FIG. 4 is a schematic diagram illustrating a first embodiment of the flexible printed circuit of this invention.

A first embodiment of the cover lay 41 is shown in FIG. 4. The completely continuous wavy contour is formed with a concave-corner contour on one of the two opposite end portions 45, 46, wherein the concave-corner contour is substantially located on an inside of the completely continuous wavy contour.

Figure 5:
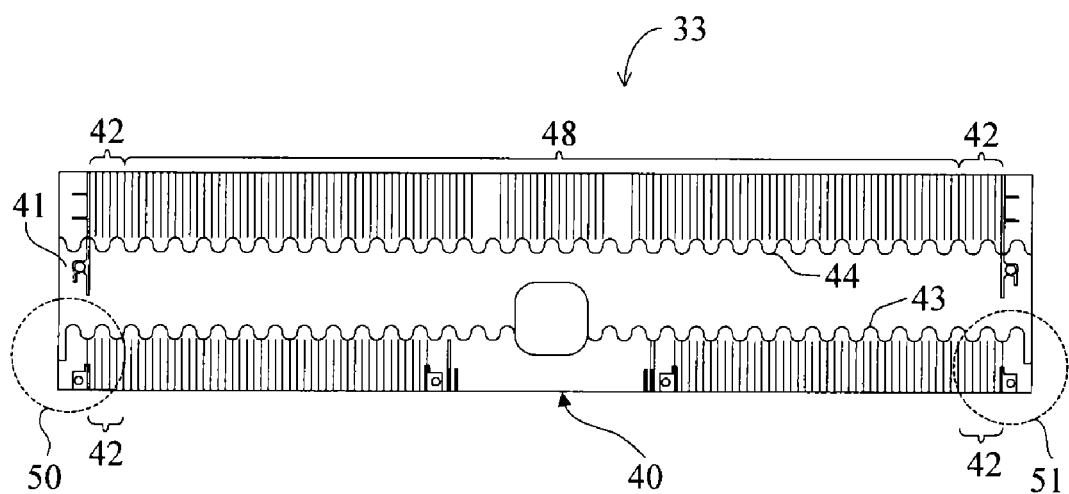
FIG. 5 is a schematic diagram illustrating a second embodiment of the flexible printed circuit of this invention.

A second embodiment of the cover lay 41 is shown in FIG. 5. The concave-corner contour of the two end portions 50, 51 is substantially located on an outside of the completely continuous wavy contour.

Figure 6:
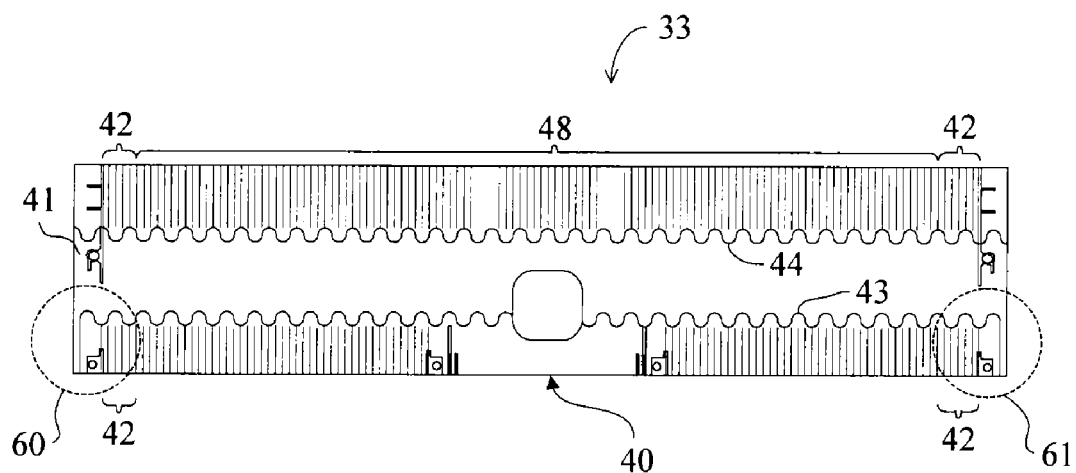
FIG. 6 is a schematic diagram illustrating a third embodiment of the flexible printed circuit of this invention.

A third embodiment of the cover lay 41 is shown in FIG. 6. The completely continuous wavy contour is substantially formed with a linear contour on either one or both of the two end portions 60, 61. The linear contour is convergent toward the cover lay 41.

Figure 7:
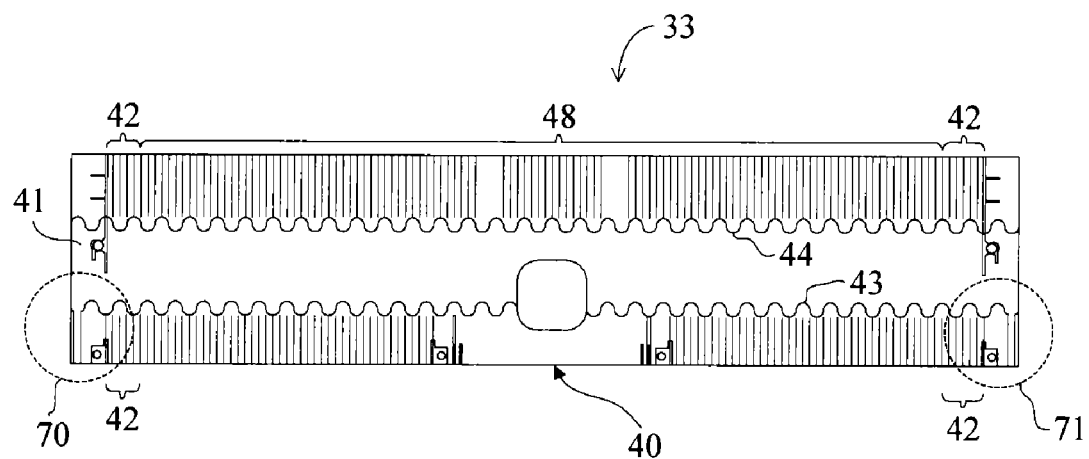
FIG. 7 is a schematic diagram illustrating a fourth embodiment of the flexible printed circuit of this invention.

A fourth embodiment of the cover lay 41 is shown in FIG. 7. The completely continuous wavy contour is substantially formed with two linear opposite contours on either one or both of the two end portions 70, 71.

Preferably, the flexible substrate 40 is made from composite material consisting of polyimide and the cover lay 41 is made from materials consisting of resin.

The above disclosure is related to the detailed technical contents and inventive features thereof. People skilled in this field may proceed with a variety of modifications and replacements based on the disclosures and suggestions of the invention as described without departing from the characteristics thereof. For example, the discontinuous status of the two opposite end portions of the flexible substrate 40 of the cover lay 41 may be changed to enhance the capability of resisting stress for the two opposite end portions of the flexible printed circuit. Although such modifications and replacements are not fully disclosed in the above descriptions, they have substantially been covered in the following claims as appended.

What is claimed is:
1. A flexible printed circuit (FPC), comprising:
a flexible substrate having an upper surface and two opposite end portions;
a printed circuit layout disposed on the upper surface of the flexible substrate, the printed circuit layout having a leading wire connecting region located on at least one of the two opposite end portions; and
a cover lay, disposed on the upper surface of the flexible substrate, and extending along a lengthwise direction of the flexible substrate, the printed circuit layout being partially disposed between the cover lay and the flexible substrate, and the cover lay having two opposite sides extending along the lengthwise direction of the flexible substrate, at least one of the two opposite sides having a completely continuous contour, and the completely continuous contour being substantially formed with a discontinuous status on at least one of the two opposite end portions, wherein the discontinuous status is substantially located at an end of the completely continuous contour, wherein a concave-corner contour is formed and extends outward in the lengthwise direction.

2. The flexible printed circuit as claimed in claim 1, wherein the completely continuous contour is a wavy contour.

3. The flexible printed circuit as claimed in claim 1, wherein the cover lay is made from materials consisting of resin.

4. The flexible printed circuit as claimed in claim 1, wherein the flexible substrate is made from composite material consisting of polyimide.

5. A display module, comprising:
a display panel;
a printed circuit board; and
a flexible printed circuit for electrically connecting the display panel to the printed circuit board, the flexible printed circuit comprising: a flexible substrate having an upper surface and two opposite end portions;
a printed circuit layout disposed on the upper surface of the flexible substrate, the printed circuit layout having a leading wire connecting region located on at least one of the two opposite end portions; and
a cover lay, disposed on the upper surface of the flexible substrate, and extending along a lengthwise direction of the flexible substrate, the printed circuit layout being partially disposed between the cover lay and the flexible substrate, and the cover lay having two opposite sides extending along the lengthwise direction of the flexible substrate, at least one of the two opposite sides having a completely continuous contour, and the completely continuous contour being substantially formed with a discontinuous status on at least one of the two opposite end portions, wherein the discontinuous status is substantially located at an end of the completely continuous contour, wherein a concave-corner contour is formed and extends outward in the lengthwise direction.

6. The display module as claimed in claim 5, wherein the completely continuous contour is a wavy contour.

7. The display module as claimed in claim 5, wherein the cover lay of the flexible printed circuit is made from materials consisting of resin.

8. The display module as claimed in claim 5, wherein the flexible substrate of the flexible printed circuit is made from composite material consisting of polyimide.

* * * * *